(12) United States Patent
Sridhar et al.

(10) Patent No.: US 11,612,978 B2
(45) Date of Patent: Mar. 28, 2023

(54) ADDITIVE MANUFACTURING OF POLISHING PADS

(71) Applicant: Applied Materials, Inc., Santa Clara, CA (US)

(72) Inventors: Uma Sridhar, Sunnyvale, CA (US); Sivapackia Ganapathiappan, Los Altos, CA (US); Ashwin Murugappan Chockalingam, San Jose, CA (US); Mayu Felicia Yamamura, San Carlos, CA (US); Daniel Redfield, Morgan Hill, CA (US); Rajeev Bajaj, Fremont, CA (US); Yingdong Luo, Newark, CA (US); Nag B. Patibandla, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 361 days.

(21) Appl. No.: 16/897,184

(22) Filed: Jun. 9, 2020

(65) Prior Publication Data

US 2021/0379725 A1    Dec. 9, 2021

(51) Int. Cl.
*B24B 37/24*      (2012.01)
*B33Y 10/00*      (2015.01)
(Continued)

(52) U.S. Cl.
CPC ............ *B24B 37/24* (2013.01); *B29C 64/112* (2017.08); *B33Y 10/00* (2014.12); *B33Y 70/00* (2014.12); *B33Y 80/00* (2014.12); *C09D 11/101* (2013.01); *C09D 11/102* (2013.01); *B29K 2063/00* (2013.01); *B29K 2075/00* (2013.01);
(Continued)

(58) Field of Classification Search
CPC . B24B 37/24; B29C 64/112; B29L 2031/736; B29K 2995/0046; B29K 2995/0089; B29K 2063/00; B29K 2075/00; B33Y 10/00; B33Y 70/00; B33Y 80/00;
(Continued)

(56) References Cited

U.S. PATENT DOCUMENTS 5,437,964 A    8/1995    Lapin et al.
5,667,842 A    9/1997    Larson et al.
(Continued)

FOREIGN PATENT DOCUMENTS

CN        110997733        4/2020
WO    WO 2013128452        9/2013
(Continued)

OTHER PUBLICATIONS

Fouassier et al., "Photochemical Production of Interpenetrating Polymer Networks; Simultaneous Initiation of Radical and Cattonic Polymerization Reactions" Polymers, 2014, 6:2588-610.
(Continued)

*Primary Examiner* — Anh T Vo
(74) *Attorney, Agent, or Firm* — Fish & Richardson P.C.

(57) ABSTRACT

Interpenetrating polymer networks (IPNs) for a forming polishing pad for a semiconductor fabrication operation are disclosed. Techniques for forming the polishing pads are provided. In an exemplary embodiment, a polishing pad includes an interpenetrating polymer network formed from a free-radically polymerized material and a cationically polymerized material.

10 Claims, 9 Drawing Sheets

(51) Int. Cl.
*C09D 11/101* (2014.01)
*C09D 11/102* (2014.01)
*B33Y 70/00* (2020.01)
*B29C 64/112* (2017.01)
*B33Y 80/00* (2015.01)
*H01L 21/306* (2006.01)
*B29L 31/00* (2006.01)
*B29K 63/00* (2006.01)
*B29K 75/00* (2006.01)

(52) U.S. Cl.
CPC ............... *B29K 2995/0046* (2013.01); *B29K 2995/0089* (2013.01); *B29L 2031/736* (2013.01); *H01L 21/30625* (2013.01)

(58) Field of Classification Search
CPC ..... C09D 11/101; C09D 11/102; C09D 11/38; H01L 21/30625
See application file for complete search history.

(56) References Cited

U.S. PATENT DOCUMENTS

| | | | |
|---|---|---|---|
| 5,738,574 | A | 4/1998 | Tolles et al. |
| 7,150,770 | B2 | 12/2006 | Keipert et al. |
| 9,067,299 | B2 | 6/2015 | Bajaj et al. |
| 9,873,180 | B2 | 1/2018 | Bajaj et al. |
| 9,993,907 | B2 | 6/2018 | Murugesh et al. |
| 10,384,330 | B2 | 8/2019 | Bajaj et al. |
| 10,399,201 | B2 | 9/2019 | Ganapathiappan et al. |
| 2006/0183412 | A1 | 8/2006 | Allison et al. |
| 2008/0214735 | A1 | 9/2008 | Kuntimaddi et al. |
| 2013/0012108 | A1 | 1/2013 | Li et al. |
| 2016/0107287 | A1 | 4/2016 | Bajaj et al. |
| 2016/0136787 | A1 | 4/2016 | Bajaj et al. |
| 2017/0203406 | A1* | 7/2017 | Ganapathiappan .... B33Y 10/00 |
| 2017/0203408 | A1 | 7/2017 | Ganapathiappan et al. |
| 2018/0290377 | A1 | 10/2018 | Talken et al. |
| 2019/0047112 | A1 | 2/2019 | Fu |
| 2019/0202024 | A1 | 7/2019 | Ganapathiappan et al. |
| 2020/0000014 | A1 | 1/2020 | Bajaj et al. |
| 2021/0379726 | A1 | 12/2021 | Sridhar et al. |

FOREIGN PATENT DOCUMENTS

| | | |
|---|---|---|
| WO | WO 2016061585 | 4/2016 |
| WO | WO 2017112653 | 6/2017 |

OTHER PUBLICATIONS

International Search Report and Written Opinion in International Appln. No. PCT/US2021/036478, dated Oct. 7, 2021, 18 pages.

Nowers, "A fundamental study of the complex structure-property-processing relationships in interpenetrating polymer networks (IPNs)," Iowa State University, 2007, 219 pages.

* cited by examiner

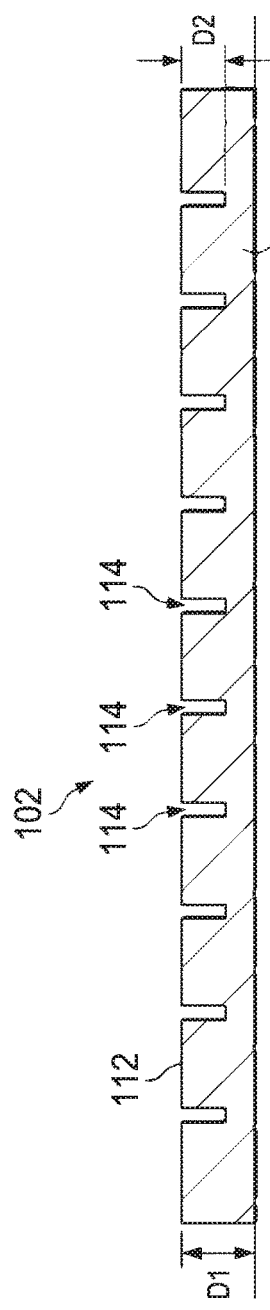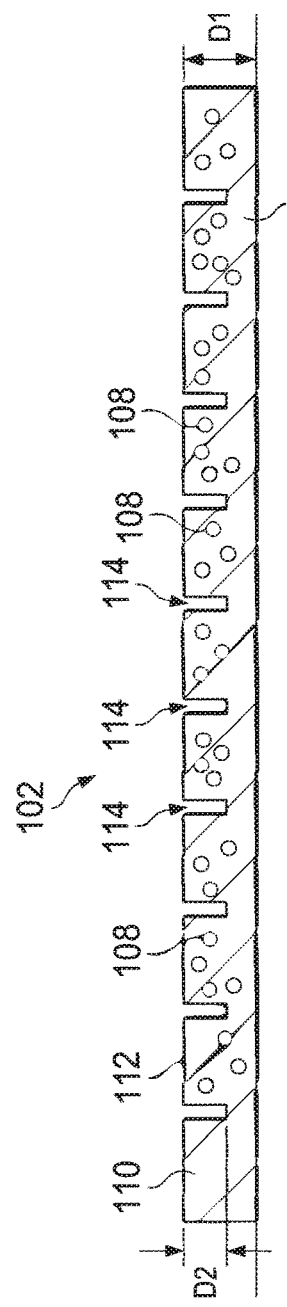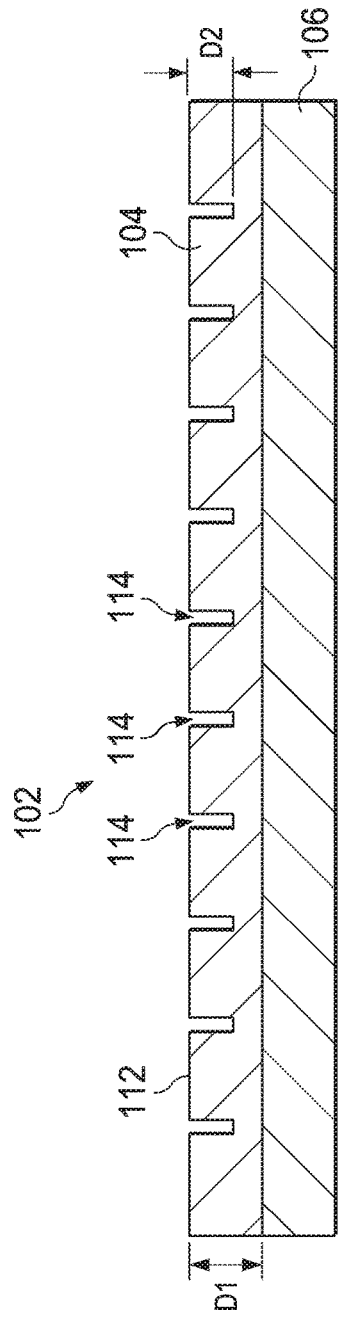

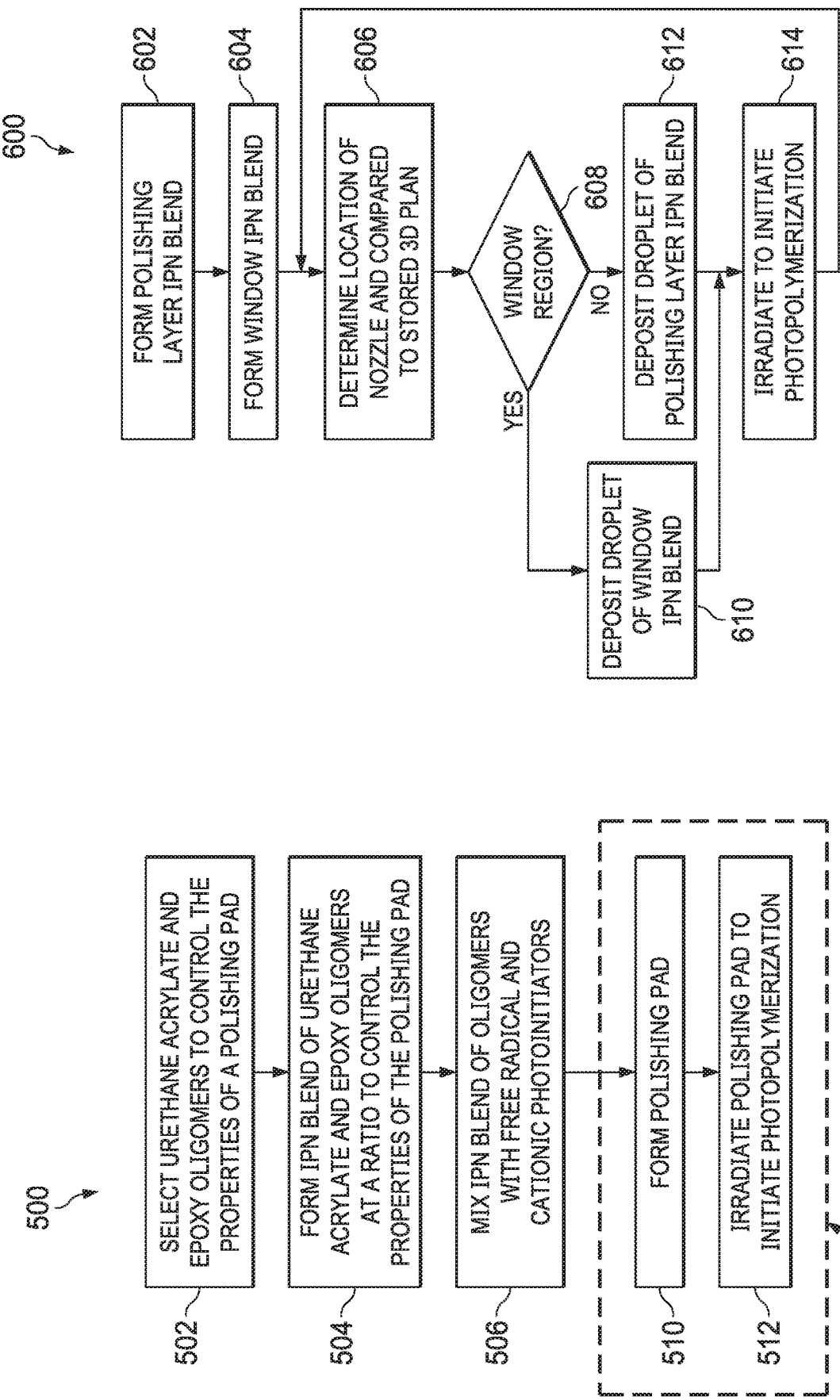

ADDITIVE MANUFACTURING OF POLISHING PADS

TECHNICAL FIELD

This disclosure relates to polishing pads utilized in chemical mechanical polishing.

BACKGROUND

An integrated circuit is typically formed on a substrate by the sequential deposition of conductive, semiconductive, or insulative layers on a silicon wafer. A variety of fabrication techniques employ planarization of a layer on the substrate. For example, for certain applications, e.g., polishing of a metal layer to form vias, plugs, and lines in the trenches of a patterned layer, an overlying layer is planarized until the top surface of a patterned layer is exposed. In other applications, e.g., planarization of a dielectric layer for photolithography, an overlying layer is polished until a desired thickness remains over the underlying layer.

Chemical mechanical polishing (CMP) is one accepted technique of planarization. In application, this planarization technique may mount the substrate on a carrier head. The exposed surface of the substrate is typically placed against a rotating polishing pad. The carrier head provides a controllable load on the substrate to push the substrate against the polishing pad. A polishing liquid, such as slurry with abrasive particles, may be supplied to the surface of the polishing pad. One objective of a chemical mechanical polishing may be polishing uniformity. If different areas on the substrate are polished at different rates, then it is possible for some areas of the substrate to have too much material removed ("overpolishing") or too little material removed ("underpolishing"). In addition to planarization, polishing pads can be used for finishing operations such as buffing.

Polishing pads for CMP may include "standard" pads and fixed-abrasive pads. A standard pad may have as a polyurethane polishing layer with a durable roughened surface, and can also include a compressible backing layer. In contrast, a fixed-abrasive pad has abrasive particles held in a containment media, and can be supported on a generally incompressible backing layer.

Polishing pads are typically made by molding, casting, or sintering polyurethane materials. In the case of molding, the polishing pads can be made one at a time, e.g., by injection molding. In the case of casting, the liquid precursor is cast and cured into a cake, which is subsequently sliced into individual pad pieces. These pad pieces can then be machined to a final thickness. Grooves can be machined into the polishing surface, or be formed as part of the injection molding process. More recently, three-dimensional printing techniques have been proposed for manufacturing of polishing pads. The pads may be formed from acrylate polymers, as described in U.S. Pat. No. 10,399,201 and 10,384,330, and US Patent Application Publication Nos. 2020/0001433 and 2019/0047112.

SUMMARY

In implementations described herein, an interpenetrating network is used to form a polishing pad. The properties of the polishing pad may be accurately controlled by adjusting a ratio of cationic materials to free-radical materials in a blend that is photopolymerized to form the polishing pad. Further, different blends may be used in different nozzles of a three-dimensional printer to adjust the properties in different regions of the polishing pad, such as the polishing surface, the body, or the backing, among others.

An implementation described herein provides a method of generating a formulation for a polishing pad including an interpenetrating polymer network (IPN). The method includes selecting a cationically polymerized material and a free-radically polymerized material to control properties of the polishing pad and blending the cationically polymerized material with the free-radically polymerized material to form a precursor blend, wherein a ratio of the cationically polymerized material to the pre-radically polymerized material in the precursor blend is selected to control the properties of the polishing pad. A free radical photoinitiator and a cationic photoinitiator are blended with the precursor blend to form an active blend, and the active blend is provided to a manufacturer to generate the polishing pad using a three-dimensional printer.

Another implementation described herein provides a method of manufacturing a polishing pad including an interpenetrating polymer network (IPN). The method includes obtaining an active blend including a free radical photoinitiator, a free-radically polymerized material, a cationic photoinitiator, a cationically polymerized material, wherein a ratio of the free-radically polymerized material to the cationically polymerized material in the active blend is selected to control properties of the polishing pad. A raw polishing pad is formed from the active blend, and the raw polishing pad is irradiated to initiate a free-radical photopolymerization of the free-radically polymerized material and a cationic photopolymerization of the cationically polymerized material.

Another implementation disclosed herein provides a polishing pad for a semiconductor fabrication operation. The polishing pad includes an interpenetrating polymer network formed from a free radically polymerized material and a cationically polymerized material.

The details of one or more implementations are set forth in the accompanying drawings and the description below. Other features and advantages will be apparent from the description and drawings, and from the claims.

BRIEF DESCRIPTION OF DRAWINGS

FIG. 1A is a schematic cross-sectional side view of an example polishing pad.

FIG. 1B is a schematic cross-sectional side view of another example polishing pad.

FIG. 1C is a schematic cross-sectional side view of yet another example polishing pad.

FIG. 5 is a block flow diagram of a method of forming a polishing pad by the 3D printing of an interpenetrating polymer network.

FIG. 6 is a block flow diagram of a method for forming a polishing pad with an inherent window region by the 3D printing of an interpenetrating polymer network.

Like reference symbols in the various drawings indicate like elements.

DETAILED DESCRIPTION

Figure 2:
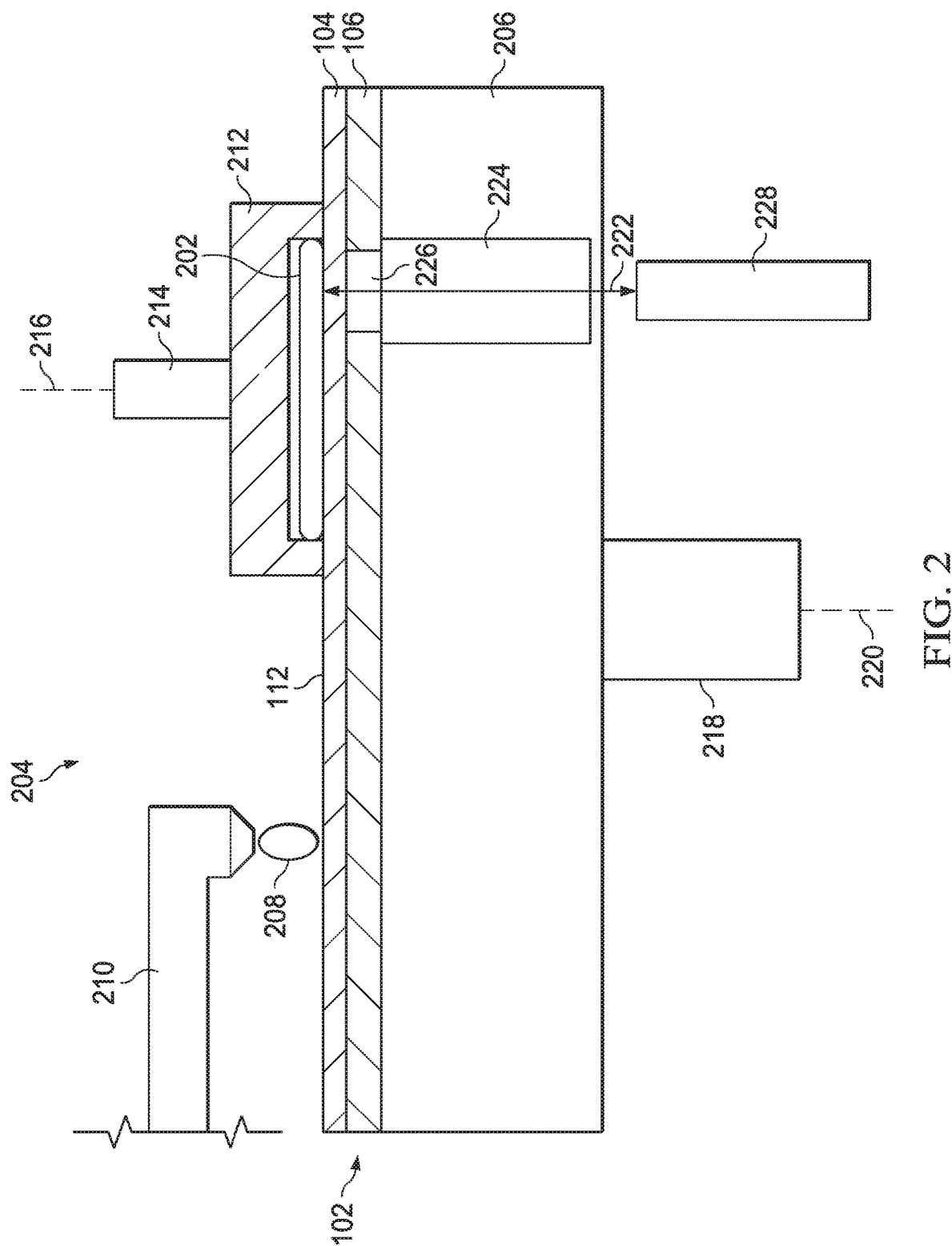
FIG. 2 is a schematic side view, partially cross-sectional, of a chemical mechanical polishing station.

To polish a wafer, a polishing pad and polishing head apply mechanical energy to the substrate. The pad also helps to control the transport of a slurry which interacts with the substrate during the polishing process. Because polishing pads are typically made from viscoelastic polymeric materials, the mechanical properties of a polishing pad (e.g., elasticity, rebound, hardness, and stiffness), and the chip manufacturing process (CMP) processing conditions have a significant impact on the CMP polishing performance on both an integrated circuit (IC) die level (microscopic or nanoscopic) and wafer or global level (macroscopic). For example, CMP process forces and conditions, such as pad compression, pad rebound, friction, and changes in temperature during processing, and abrasive aqueous slurry chemistries will impact polishing pad properties and thus CMP performance.

Current pad materials and methods to produce them limit the manipulation and fine control bulk pad properties such as storage modulus (E') and loss modulus (E"), which play critical roles in pad performance. Therefore, uniform CMP requires a pad material and polishing surface with a predictable and finely controlled balance of storage modulus E and loss modulus E", that are further maintained over a CMP processing temperature range, from, for example, about 30° C. to about 90° C. The polishing surface also requires features, such as grooves and channels, to carry polishing liquid.

However, conventional pad production via traditional bulk polymerization and casting and molding techniques only provide a degree of pad property (e.g., modulus) control, because the pad is a random mixture of phase separated macromolecular domains that are subject to intramolecular repulsive and attractive forces and variable polymer chain entanglement. For example, the presence of phase separated macroscopic structural domains in the bulk pad may yield an additive combination of non-linear material responses, such as a hysteresis in the storage modulus (E') over multiple heating and cooling cycles that typically occur during the CMP processing of batches of substrates, which may result polishing non-uniformities and unpredictable performance across the batch of substrates.

Because of the drawbacks associated with conventional polishing pads and their methods of manufacture, there is a need for new polishing pad materials and new methods of manufacturing polishing pads that provide control of pad feature geometry, and fine control of the pad's material, chemical and physical properties. Such improvements are expected to yield improved polishing uniformity at both a microscopic level and macroscopic level, such as over the entire substrate.

Some aspects of the present disclosure are directed to a formulation comprising monomers that form an interpenetrating polymer network (IPN) for the formation of a polishing layer of a polishing pad. In one implementation, the formulation is applied to form the polishing pad by an additive manufacturing process, such as three dimensional (3D) printing. In 3D printing, a printhead ejects droplets of the formulation onto a surface from a nozzle, then cures the droplets with light, e.g., ultraviolet light, from a light source, such as an LED or focused lamp in the printer. Although the 3D printing provides significant advantages, in some implementations, the IPN formulation may be cast in a mold, then exposed to a bulk UV light for curing.

The technique may include preparing a blend that includes free radically polymerized materials, such as urethane acrylate oligomers, ester acrylates, or ether acrylates, among others. The blend also includes cationically polymerized materials, such as epoxy oligomers. Other components, including monomers, stabilizers, and the like, are then added to adjust properties of the blend, such as the viscosity. Free radical and cationic photoinitiators are added to form an active blend. With the oligomers of the present techniques, the active blend may have a relatively low viscosity to facilitate 3D printing of the formulation for manufacturing CMP polishing pads. The formulation may then be 3D printed to make the CMP Pads. The CMP pads may have a high modulus and good elasticity for semiconductor applications.

Referring to FIG. 1A-1C, a polishing pad 102 includes a polishing layer 104. As shown in FIG. 1A the polishing pad can be a single-layer pad that consists of the polishing layer 104, or as shown in FIG. 1C the polishing pad can be a multi-layer pad that includes the polishing layer 104 and at least one backing layer 106.

The polishing layer 104 can be a material that is inert in the polishing. The material of the polishing layer 104 can be a plastic, e.g., an interpenetrating network formed from a blend of a urethane acrylate oligomer and in epoxy oligomer. In some implementations the polishing layer 104 is a relative durable and hard material. For example, the polishing layer 104 can have a hardness of about 40 to 80, e.g., 50 to 65, on the Shore D scale.

As shown in FIG. 1A, the polishing layer 104 can be a layer of homogeneous composition, e.g., formed from the IPN with no additional components. In some implementations, the polishing layer includes pores, e.g., small voids. The pores can be 50-100 microns wide. Such pores need not detract from the generally homogeneous composition of the polishing layer 140.

As shown in FIG. 1B the polishing layer 104 can include abrasive particles 108 held in a matrix 110 of plastic material, e.g., an interpenetrating network of polyurethane and epoxide. The abrasive particles 108 are harder than the material of the matrix 110. The abrasive particles 108 can be from 0.05 weight percent (wt. %) to 75 wt. % of the polishing layer. For example, the abrasive particles 108 can be less than 1 wt. % of the polishing layer 104, e.g., less than 0.1 wt. %. Alternatively, the abrasive particles 108 can be greater than 10 wt. % of the polishing layer 104, e.g., greater than 50 wt. %. The material of the abrasive particles can be a metal oxide, such as ceria; alumina, or silica; or any combinations thereof.

The polishing layer 104 can have a thickness D1 of 80 mils or less, 50 mils or less, or 25 mils or less. Because the conditioning process tends to wear away the cover layer, the thickness of the polishing layer 104 can be selected to provide the polishing pad 102 with a useful lifetime, e.g., 3000 polishing and conditioning cycles.

On a microscopic scale, the polishing surface 112 of the polishing layer 104 can have rough surface texture, e.g., a root mean squared (rms) surface-roughness of 2-4 microns. For instance, the polishing layer 104 can be subject to a grinding or conditioning process to generate the rough surface texture. In addition, 3D printing can provide small uniform features, e.g., down to 200 microns.

Although the polishing surface 112 can be rough on a microscopic scale, the polishing layer 104 can have good thickness uniformity on the macroscopic scale of the polishing pad itself. This uniformity may refer to the global variation in height of the polishing surface 112 relative to the bottom surface of the polishing layer, and does not count any macroscopic grooves or perforations deliberately formed in the polishing layer. The thickness non-uniformity can be less than 1 mil.

In some implementations, at least a portion of the polishing surface 112 can include a plurality of grooves 114 formed therein for carrying slurry. The grooves 114 may be of nearly any pattern, such as concentric circles; straight lines, a cross-hatched, spirals, and the like. In implementations with grooves present, then on the polishing surface 112, the plateaus between the grooves 114 can be, for example, 25-90% of the total horizontal surface area of the polishing pad 102. Thus, the grooves 114 can occupy 10%-75% of the total horizontal surface area of the polishing pad 102. The plateaus between the grooves 114 can have a lateral width of about 0.1 to 2.5 mm.

In some implementations, e.g.; if there is a backing layer 106, the grooves 114 can extend entirely through the polishing layer 104. In some implementations, the grooves 114 can extend through about 20-80%, e.g., at 40-60%, of the thickness of the polishing layer 104. The depth of the grooves 114 can be 0.25 to 1 mm. For example, in a polishing pad 102 having a polishing layer 104 that is 40-60 mils thick, e.g., 50 mils thick, the grooves 114 can have a depth D2 of about 15-25 mils, e.g., 20 mils.

The backing layer 106 can be softer and more compressible than the polishing layer 104. The backing layer 106 can have a hardness of 80 or less on the Shore A scale, e.g., a hardness of about 60 Shore A or less. The backing layer 106 can be thicker or thinner than (or the same thickness as) the polishing layer 104.

In certain implementations, the backing layer 106 can be an open-cell or a closed-cell foam, such as polyurethane or polysilicone with voids, so that under pressure the cells collapse and the backing layer compresses. Examples of material for the backing layer are PORON 4701-30 from Rogers Corporation, in Rogers, Conn., or SUBA-IV from Rohm & Haas. The hardness of the backing layer 106 can generally be adjusted by selection of the layer material and porosity. Alternatively, the backing layer 106 can be formed from the same precursor and have the same porosity as the polishing layer, but have a different degree of curing, or a different IPN composition, so as to have a different hardness. In these implementations, the ratio between the free radically polymerized oligomer and the cationically polymerized oligomer can be adjusted to change the modulus of the backing material.

Turning now to FIG. 2, one or more substrates 202 can be polished at a polishing station 204 of a CMP apparatus. A description of an applicable polishing apparatus can be found in U.S. Pat. No. 5,738,574.

The polishing station 204 can include a rotatable platen 206 on which is placed the polishing pad 102. During polishing, a polishing liquid 208, e.g., abrasive slurry, can be supplied to the surface of polishing pad 102 by a slurry supply port or combined slurry/rinse arm 210. The polishing liquid 208 can contain abrasive particles, a pH adjuster, or chemically active components.

The substrate 202 is held against the polishing pad 102 by a carrier head 212. The carrier head 212 is suspended from a support structure, such as a carousel, and is connected by a carrier drive shaft 214 to a carrier head rotation motor so that the carrier head can rotate about an axis 216. As the carrier head 212 is rotated about the axis 216, the rotatable platen 206 is rotated by a platen axis 218 around a vertical axis 220. The relative motion of the polishing pad 102 and the substrate 202 in the presence of the polishing liquid 208 results in polishing of the substrate 202.

An in-situ monitoring system, e.g., an optical endpoint monitoring system, eddy current monitoring system, motor current monitoring system, etc., can be used in a CMP process to determine when a substrate 202 or a bulk film has been polished to a desired thickness when the contact material has been removed from the field (upper surface) of a layer. This can be performed using optical techniques, for example, in which a light beam 222 is directed towards the substrate 202 through a window 224 in the rotatable platen 206 and through a polishing pad window 226. The light beam 222 may be intermittently reflected from the surface of the substrate 202 as the rotatable platen 206 rotates. An optical system 228 may use interferometry or changes in the reflectance of the substrate 202 to determine the removal of material from the surface of the substrate 202. As described herein, the polishing pad window 226 is generally made from the same material as the polishing layer 104, for example, formed by 3D printing of the polishing pad window 226 during the 3D printing of the polishing pad 102. For optical clarity, the polishing pad window 226 may include a lower amount of photoinitiators, which absorb light. Further, the polishing pad window 226 may not include the abrasive particles 108, described with respect to FIG. 1.

Figure 3:
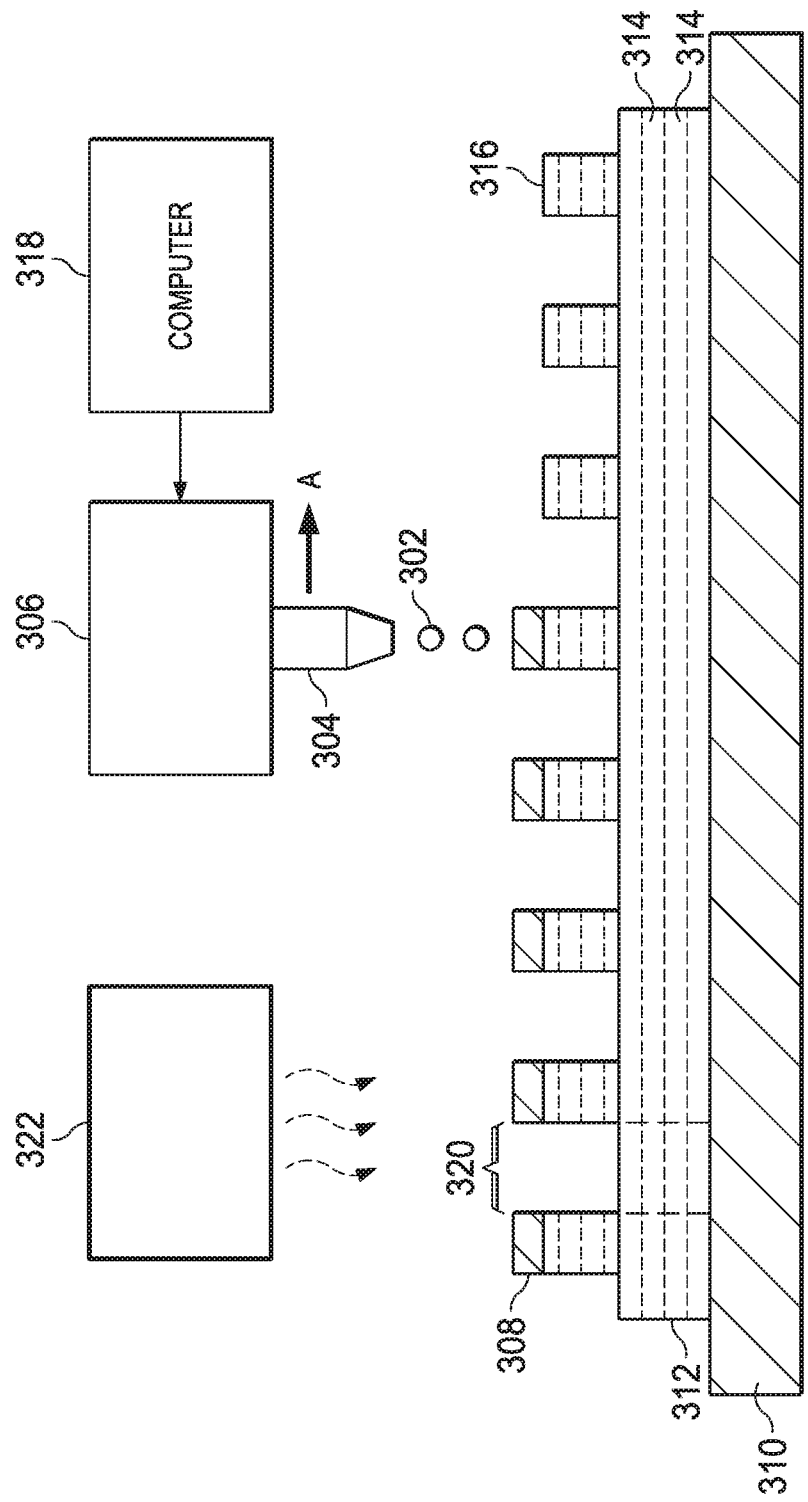
FIG. 3 is a schematic side view illustrating a substrate in contact with the polishing pad of FIG. 1A.

Referring to FIG. 3, at least the polishing layer 104 (FIG. 1) of the polishing pad 102 is manufactured utilizing 3D printing. In the manufacturing, thin layers of material are progressively deposited and fused. For example, droplets 302 of a formulation of pad precursor material can be ejected from a nozzle 304 of a droplet ejecting printer 306 to form a layer 308. The droplet ejecting printer 306 is similar to an inkjet printer, but employs the pad precursor material rather than ink. The nozzle 304 translates (shown by arrow A) across a support 310.

For a first layer 312 deposited, the nozzle 304 can eject onto the support 310. For subsequently deposited layers 314, the nozzle 304 can eject onto the already solidified material 316. After each layer 308 is solidified, a new layer is then deposited over the previously deposited layer until the full 3-dimensional polishing layer 104 is fabricated. Each layer is applied by the nozzle 304 in a pattern stored in a 3D drawing computer program that runs on a computer 318. Each layer 308 is less than 50% of the total thickness of the polishing layer 104, e.g., less than 10%, e.g., less than 5%, e.g., less than 1%.

During the deposition of the layers 312 and 314, a window region 320 may be deposited. The window region 320 may be formed from an IPN blend with a lower concentration of photoinitiators to improve the transparency for the measurement wavelengths, e.g., with a cutoff below 350 nm, below 375 nm, or below 400 nm. As used herein, a cutoff indicates a point wherein the transmittance drops below 50% of the transmittance at 800 nm as the wavelength is decreased. Further, the material used in the window region may not include abrasive particles, further increasing the light transmittance. The window region 320 can be located in the groove(s) between raised plateaus as illustrated, or the raised plateaus can provide part of the window region 320.

To change the material deposited on the pad, the droplet ejecting printer 306 may include additional nozzles that are coupled to reservoirs holding different materials. For example, one reservoir may hold a normal IPN blend material used to form most of the polishing layer 104, while a second reservoir feeding another nozzle may include an IPN blend material with a lower concentration of the photoinitiators, and no abrasives. For further customization of the properties of the pads, additional nozzles may print only the epoxy oligomer blend with a cationic photoinitiator, while other nozzles may print only the urethane acrylic oligomer with the free radical photoinitiator, allowing customization of the blend used for a region. Other combinations, such as changes in a blend ratio that includes both epoxy oligomers and urethane acrylic oligomers, may be used.

The support 310 can be a rigid base, or be a flexible film, e.g., a layer of polytetrafluoroethylene (PTFE). If the support 310 is a film, the support 310 can form a portion of the polishing pad 102. For example, the support 310 can be the backing layer 106 or a layer between the backing layer 106 and the polishing layer 104. Alternatively, the polishing layer 104 can be removed from the support 310, and applied to a backing layer 106.

Solidification can be accomplished by polymerization. For example, the layer 308 of pad precursor material can be a blend that includes an epoxy oligomer and a urethane oligomer, along with the relevant photoinitiators. The blend can be polymerized in-situ by light, e.g., ultraviolet (UV) curing using a UV source 322. The UV source 322 may emit a broad UV spectrum, including, for example, UV-A and UV-B, or UV-A, UV-B, and UV-C. In some implementations, a narrow bandwidth source, such as a UV LED laser may be used.

The pad precursor material can be cured effectively immediately upon deposition, or an entire layer 308 of pad precursor material can be deposited and then the entire layer 308 be cured simultaneously. Further, a partial cure may be effected during printing, with a full cure being carried out by annealing under a large UV source, or in an oven. As the epoxy oligomers cure more slowly that the urethane acrylate oligomers, a hold time after printing, even without additional light or heat annealing, may be used to achieve full properties.

In addition to 3D printing, other technologies may be used to form the polishing layer 104 from the IPN blend, as described herein. For example, the polishing layer 104 may be cast by placing the IPN blend in a mold, and irradiating to form the final shape. A window may be formed using leaving a circular mold to form a hole in the polishing layer 104 during the casting procedure. After the polishing layer 104 is cured, the hole can be filled with an IPN blend that includes a lower amount of photoinitiator. Curing the window material may couple it to the polymer structure of the surrounding polishing layer 104.

The 3D printing generally avoids the need for making molds, which can be relatively expensive and add time in the manufacturing. The 3D printing may eliminate several conventional-pad manufacturing steps, such as molding, casting, and machining. Further, in conventional methods, windows may pop out during CMP or may not be coplanar with respect to the surface of the pads resulting in uneven surfaces. Additionally, tight tolerances can generally be achieved in 3D printing due to the layer-by-layer printing. Also, one printing system (with printer 306 and computer 318) can be employed to manufacture a variety of different polishing pads, simply by changing the pattern stored in the 3D drawing computer program in certain implementations. Further, the use of additional nozzles can allow for customization of properties during the printing process.

In some implementations, the backing layer 106 can also be fabricated by 3D printing. For example, the backing layer 106 and polishing layer 104 could be fabricated in an uninterrupted operation by the printer 306. The backing layer 106 can be provided with a different hardness than the polishing layer 104, for example, by applying a different amount of curing, e.g., a different intensity of UV radiation. In some implementations, the backing layer is formed using a different IPN blend. The backing layer 106 may also include a window region, aligned with the window region 320 in the polishing layer 104.

In other implementations, the backing layer 106 is fabricated by a conventional process and then secured to the polishing layer 104. For instance, the polishing layer 104 can be secured to the backing layer 106 by a thin adhesive layer, e.g., as a pressure-sensitive adhesive.

Figure 4:
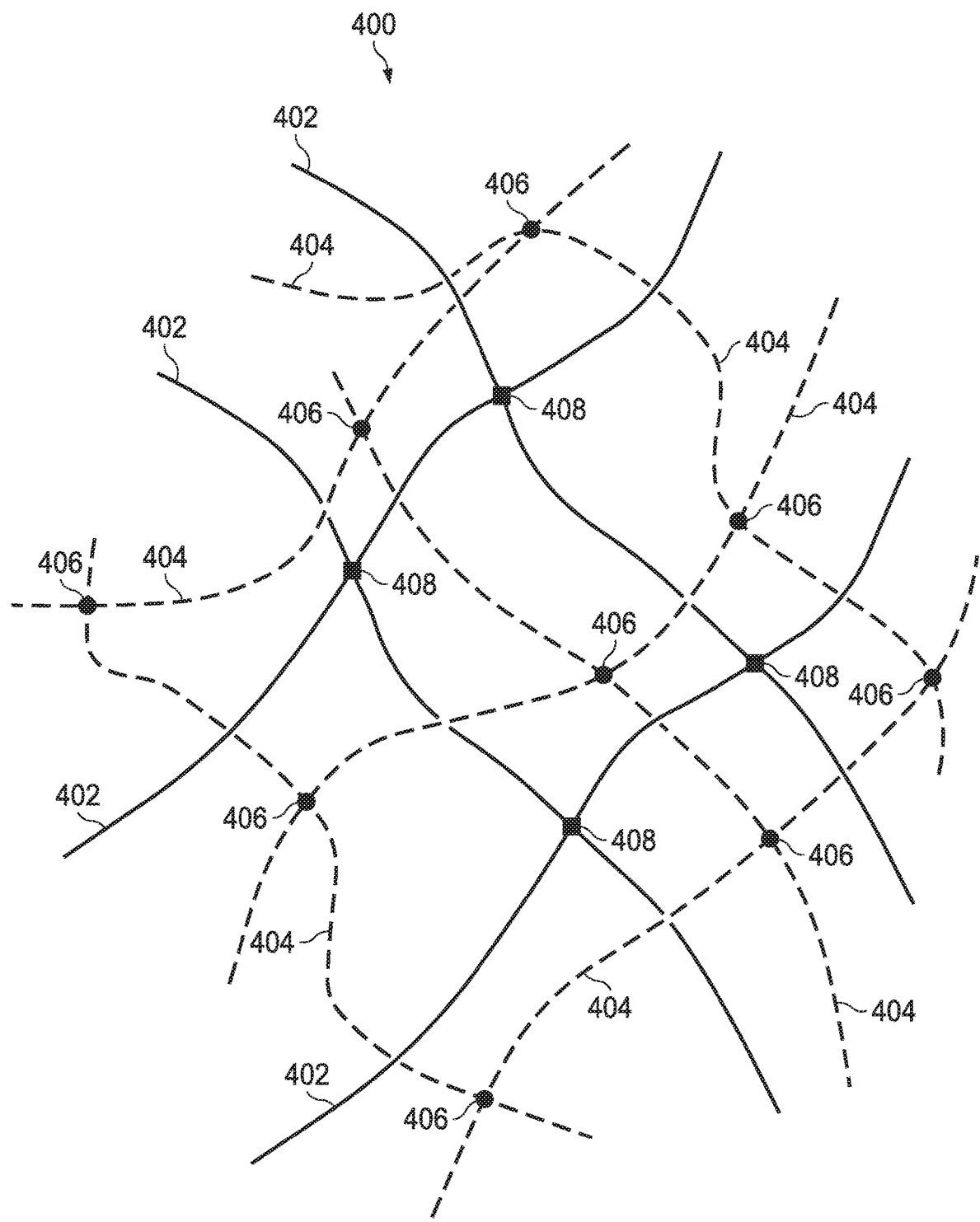
FIG. 4 is a drawing of an interpenetrating polymer network.

FIG. 4 is a schematic drawing of an interpenetrating polymer network (IPN) 400 of two cross-linked polymers. As used herein, an IPN 400 may be defined as an interpenetrating network of two or more polymers, such as polymers 402 and 404, in which each of the polymers 402 and 404 is crosslinked with other polymer chains of substantially the same type, i.e., polymer chains of polymer 402 are cross-linked with other polymer chains of polymer 402, and polymer chains of polymer 404 are cross-linked with other polymer chains of polymer 404. Some small amount of cross-linkage between polymers 402 and 404 is permissible, e.g., less than 5%, e.g., less than 1% of the linkages. An IPN 400 may be formed from a blend of monomers or oligomers, e.g., the IPN blend, as used herein, with at least one of the polymers synthesized in the presence of another.

The IPN 400 may be formed using cross-linking polymerization of two multifunctional oligomers that polymerize through different mechanisms, such as free radical polymerization and cationic polymerization. In the example of FIG. 4, a polyurethane acrylate oligomer is cross-linked though free-radical links 406 to form polymer 402, while an epoxy oligomer is cross-linked through cationic links 408 to form an interpenetrating polymer 404. This produces a "physically cross-linked" network wherein cross-linked polymer chains of one polymer, e.g., polymer 402, are entangled with and/or penetrate the network formed by cross-linked chains of the other polymer, e.g., 404. Each individual network retains its individual properties, so that synergistic improvements in properties including E'30, E'90, E'30/E'90, strength, toughness, compression and elongation may be made through changes to the concentrations of the components.

An IPN 400 can be distinguished from the other multiple systems or networks through their multi-continuous structure ideally formed by the physical entanglement or interlacement of at least two polymers that are in intimate physical contact but may or may not be chemically bounded to one another. Photoinitiated polymerization has been a very efficient way to obtain IPNs and is initiated by a monomer mixture such as acrylates, which polymerize by a radical mechanism, and epoxides, which polymerize by a cationic mechanism. UV irradiation has been explored heavily to produce IPNs.

FIG. 5 is a method 500 of forming a polishing pad from an IPN. The polishing pad may be a CMP pad. The method 500 begins at block 502, with the selection of a urethane acrylate oligomer and an epoxy oligomer. The oligomers are chosen to control the properties of a polishing pad.

Typical material composition properties that can be selected using the methods and material compositions described herein include storage modulus E', loss modulus E", hardness, tan δ, yield strength, ultimate tensile strength, elongation, glass transition temperature (Tg) and other related properties. It is desirable for the window material to have a similar storage modulus as the surrounding polishing elements so that the window material wears at a similar rate and does not extend above or below the surface or the polishing pad over the lifetime. The properties that can be controlled by include the modulus, or stiffness, of the polishing pad. Different moduli can be selected for different applications and lifespan. Generally, three modulus ranges may be used, as shown in Table 1.

TABLE 1

| Moduli used for polishing pads | | |
| --- | --- | --- |
| Low Modulus Compositions | Medium Modulus Compositions | High Modulus Compositions |
| E'30 5 MPa-100 MPa | 100 MPa-500 MPa | 500 MPa-3000 MPa |

The moduli may be controlled by the selection of the urethane acrylate oligomer and the epoxy oligomer as well as by the ratio of the urethane acrylate oligomer to the epoxy oligomer. Other properties may be controlled by the selections of the oligomers as well as the ratios of the oligomers used to form the IPNs. Accordingly, the control of ratios and oligomers allow the properties of polishing pads to be tuned to create a desired composite of properties within a layer and/or layer by layer, such as those properties including E30, E'90, E'30/E'90, strength, toughness, compression, and elongation.

In various implementations, the IPN blend, or active blend, includes a material that is polymerized by a free radical mechanism, such as a urethane acrylate oligomer, an ester acrylate, an ether acrylate, or monomer. The IPN blend also includes a material that is polymerized by a cationic mechanism, such as an epoxy oligomer. The IPN blend also includes a free radical photoinitiator and a cationic photoinitiator Each of the oligomers, such as the urethane acrylate oligomer and the epoxy oligomer, can be part of a blend of components. In some implementations, the IPN blend also includes a monomer and an additive. The additive may be, for example, silicones, polyether silicones, or surfactants. In implementations, the formulation need not include a solvent as solvent can act as plasticizer to reduce or adversely affect mechanical properties.

In various implementations described herein, the cationically polymerized formulation includes 3,4-epoxycyclohexylcarboxylate (available as Celloxide 2021P from Daicel Corp of Tokyo), 3-ethyl-3-hydroxymethyl-oxetane (available as OXT 101 from Toagosei Co. of Tokyo) and polycaprolactone (available in the PLACCEL line of products from Daicel). Other monomers or oligomers may be used in addition to or in place of these, including, for example, Celloxide 2080, Celloxide 2000, OXT 101, OXT 121, OXT 221, Placcel 205U, Placcel 305, or polypropylene glycol, among others.

In various implementations described herein, the free radically polymerized formulation includes a polyester urethane acrylate, such as BR744SD, BR744BT, BRC 841, BRC 843, BR 741, BR742S, BR 771F, or BR 7432G130, among others available in the Bomar product line from Dymax Oligomers and Coatings of Torrington, Conn., USA. Other materials that may be used in the free radically polymerized formulation include trimethylolpropane triacrylate (TMPTA) (available as SR351H from Sartomer Arkema of Exton, Pa., USA), and CN 8881, 9004, 9009, 99030, 9031, 964, 981, 991, or 996 (available in the Sartomer N3XT dimension series from Sartomer). Any number of other monomers and oligomers, such as acrylic acid, may be included in the formulation. Further, crosslinking agents used in the formulations could include EB40 from Allnex, TPGDA, or multifunctional acrylates, among others.

In various implementations described herein, the free-radical, or acrylate, photoinitiators used include an acyl phosphine oxide (such as Omnirad 819 available from IGM Resins of Waalwijk, The Netherlands), an alpha hydroxy ketone (such as Omnirad 2959, available from IGM Resins), or 2-Methyl-4'-(methylthio)-2-morpholinopropiophenone (available as Omnirad 907 from IGM Resins). Similar free radical photoinitiators may be used in addition to, or in combination with, these initiators. The choice of the photoinitiator may be made based on the viscosity of the resulting solution and the absorbance of the photoinitiator, such as in a window application as described herein.

In various implementations described herein, the cationic photoinitiator is Omnicat 250, available from IGM Resins, Omnicat 250 is a 75% blend of (4-methylphenyl)[4-(2-methylpropyl) phenyl]-, hexafluorophosphate(1-) in 25% propylene carbonate, Other cationic photoinitiators may be used instead of, or in addition to, Omnicat 250, such as other cationic photoinitiators in the Omnicat product line from IGM Resins, including, for example, sulfonium hexafluro phosphate (Omnicat 270), or Omnicat 250, 440, 432, BL 550, and 320, among others. The choice of the photoinitiator may be made based on the viscosity of the resulting solution, and the absorbance of the photoinitiator, such as in a window application as described herein.

At block 504, the IPN blend is made from the urethane acrylate oligomer and the epoxy oligomer at a ratio to control the properties of the polishing pad. For example, increasing the amount of the epoxy oligomer in the IPN blend may increase the stiffness of the resulting polishing pad. Further, the IPN blend may be a viscous liquid, in which the viscosity can be adjusted by modifying the ratio of the urethane acrylate oligomer to the epoxy oligomer. The choice of the urethane acrylate oligomer and the epoxy oligomer may also be used to adjust the viscosity of the IPN blend. For example, the IPN blend used for 3D printing may be a free-flowing viscous liquid at a viscosity in a range of about 10 centipoise (cP) to a maximum value of about 20 cP at a temperature of 70° C. The polishing layer fabricated by the 3D printing utilizing the formulation may have an elongation at break of at least 8% and ultimate tensile strength (UTS) of at least about 30 megapascals (MPa). The correlation of properties to the ratio of the oligomers in the IPN plant is discussed further with respect to the examples.

At block 506, the IPN blend is mixed with the photoinitiators to form an active blend. As described herein the photoinitiators include free radical initiators, for example, used to initiate the polymerization of the urethane acrylate oligomer. The photoinitiators also include cationic photoinitiators, for example, used to initiate the polymerization of the epoxy oligomers. Further, as described with respect to FIG. 6, a different IPN blend may be used for different portions of the polishing pad, such as a window used for endpoint detection in the polishing process.

At block 508, the polishing pad is made, for example, by a manufacturer at a semiconductor fabrication plant. This may be a single step, for example, during a 3D printing process using the printing of droplets of the active blend to form the polishing pad. In some implementations, a polishing pad may be cast from an IPN blend. This polishing pad is formed as described at block 510. At block 512 the polishing pad is irradiated to initiate photopolymerization, e.g., curing. At block 510, droplets may be ejected from the nozzles at target locations as determined by a file in the computer that includes 3D plans for the polishing pad.

At block 512, the formulation having the urethane acrylate oligomer and epoxy oligomer is subjected to photopolymerization to form the layer of the polishing pad. The irradiation may be performed at different levels during the process. For example, an initial radiation may be performed to fix droplets in place, while a more intense radiation may be used to cure the entire layer, either after the layer is deposited, or after the entire structure is created.

Once the 3D printing of the polishing pad is completed, the polishing pad may be annealed under a UV lamp or in an oven for further curing. It can be noted that the curing will continue to take place after the formation of the polishing pad, even without annealing. Accordingly, the polishing pad may be allowed to rest before use to allow for further cure time. As described herein, the additives and oligomer ratio may be used to adjust the viscosity and curability of the formulation and the mechanical properties of the polishing pad.

FIG. 6 is a block flow diagram of a method 600 for forming a polishing pad with an inherent window region by the 3D printing of an interpenetrating polymer network. The method begins at block 602 with the formation of the polishing layer IPN blend. This may be done as described herein, for example, using the ingredients discussed with respect to FIG. 5. The proportions of the ingredients used may be as described with respect to the examples.

At block 604, the window IPN blend is formed. Generally, the proportions of the oligomers and other ingredients in the window IPN blend will match the polishing layer IPN blend, so that the properties will also match. However, the amounts of photoinitiators in the window IPN blend may be lower than in the polishing layer IPN blend, as the photoinitiators may absorb light in a region used for the endpoint detection for the polishing operation. For example, in various implementations, the photoinitiators may be decreased by about 5% with respect to the polishing layer IPN, or by about 10%, or by about 20%, or more. This will slow down the curing of the window region with respect to the rest of the polishing layer. The blends are then loaded into the 3D printer, for example, in reservoirs for at least two different droplet ejectors in the nozzle. Once the blends are loaded, the polishing pad with the inherent window region is printed.

At block 606, the location of the nozzle is determined and compared to a stored 3D plan of the polishing pad. At block 608, a determination is made as to whether the nozzle is over a window region of the polishing pad. If so, at block 610, a droplet of the window IPN blend is deposited at the target location. If not, at block 612, a droplet of the polishing layer IPN blend is deposited with target location.

Once the droplet is deposited, at block 614, the target location is irradiated to initiate photopolymerization and fix the droplet in place. This may be done using a number of different techniques. In an implementation, a lower power irradiation may start a top cure of the photopolymerization, which may be used just to fix the droplet in place while other droplets are deposited. This may be then followed by a more intense irradiation to initiate a full cure, or bottom cure, once the entire polishing pad is formed. In another implementation, a curing lamp may be passed over the polishing pad once a full layer has been printed to start a top cure of that layer. It can be noted that upper layers printed on lower layers that have already started to cure may bond to the lower layers shortly after being printed, through the reactions that have already initiated in the lower layers.

EXAMPLES

The examples are given only as examples and not meant to limit the present techniques. A number of different mixtures were made to determine the properties of the IPNs as the ratios of the components were varied. The components used were as discussed with respect to FIG. 5.

The experiments were carried out by mixing compositions containing the radical and cationic components in the proportions shown in Table 1. The formulations were cured bulk in a silicone mold of Type V dogbones (with thickness of 2 mm) by exposing to UV light of about 1150 mJ/cm$^2$ in a Heraeus UV curing station with 3 passes at 18 ft/min (each pass exposed at 380 mJ/cm2). In practice, these formulations may be 3D printed and then cured to make CMP Pads, including CMP Pads having a high modulus and good elasticity for semiconductor applications. Accordingly the UV dosage can be reduced depending up on the thickness of samples.

Dynamic mechanical analysis (DMA) was performed on the UV-cured films. The main parameters that can be obtained are E and tan δ. E' is the storage modulus, the elastic component of the complex modulus, E. Tan δ is the damping factor, calculated as the ratio E"/E', in which E" is the loss modulus, the dissipative component of the complex modulus E' of the viscoelastic material. Importantly, the molecular weight, chain length and branching of the polymer may play a role in the weight percent of polymer due to such factors that include polymer miscibility and mixture viscosity.

TABLE 1

Compositions used to test properties of IPNs for polishing pads.

| | | Radical composition | | Cationic composition | | |
| --- | --- | --- | --- | --- | --- | --- |
| Radical composition (wt. %) | Cationic composition (wt. %) | BR 744SD (wt. %) | SR 351H (wt. %) | Celloxide 2021 P (wt. %) | OXT 101 (wt. %) | PCL-205U (wt. %) |
| 100 | 0 | 20 | 80 | 0 | 0 | 0 |
| 90 | 10 | 18 | 72 | 5.7 | 1.3 | 3 |

TABLE 1-continued

Compositions used to test properties of IPNs for polishing pads.

| Radical composition (wt. %) | Cationic composition (wt. %) | Radical composition | | Cationic composition | | |
|---|---|---|---|---|---|---|
| | | BR 744SD (wt. %) | SR 351H (wt. %) | Celloxide 2021 P (wt. %) | OXT 101 (wt. %) | PCL-205U (wt. %) |
| 75 | 25 | 15 | 60 | 14.25 | 3.25 | 7.5 |
| 55 | 45 | 11 | 44 | 25.65 | 5.85 | 13.5 |
| 35 | 65 | 7 | 28 | 37.05 | 8.45 | 19.5 |
| 0 | 100 | 0 | 0 | 57 | 13 | 30 |

Note that 0.5 wt. % of each of the cationic and radical photoinitiators were used.

As described herein, IPNs are used to tune and adjust the properties of polishing pads to create a desired composite of properties within a layer and/or layer by layer, such as those properties including E'30, E'90, E'30/E90, strength, toughness, compression, and elongation.

Figure 7A:
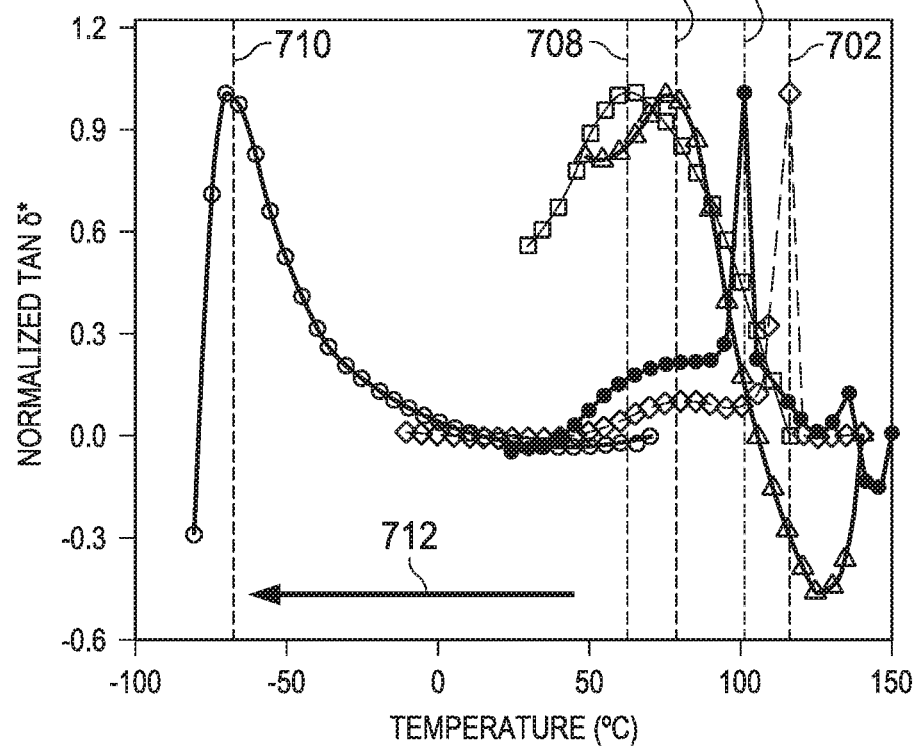
FIG. 7A is a plot of Tan δ measured by dynamic mechanical analysis (DMA) of pure cationic polymers and interpenetrating polymer networks as a function of increasing cationic polymer composition.

FIG. 7A is a plot of Tan δ as measured by dynamic mechanical analysis (DMA) of pure cationic polymers and interpenetrating polymer networks as a function of increasing cationic polymer composition. As shown in FIG. 7A, the 100% cationic, or pristine cationic polymer 702, has the highest Tg at 115° C. However, a 10% cationic polymer 704 is nearly as high, at a Tg of 100° C. Increasing to a 25% cationic polymer 706 drops the Tg further, to a value of 78° C. A 45% cationic polymer 708 has a Tg of about 62° C., and a 65% cationic polymer has a Tg of about −65° C. Thus, as the cationic polymer content increases (arrow 712) from 10% to 65%, the Tg falls. It can be noted that the kinetics of polymerization are faster for the free-radical materials, inhibiting the formal of the epoxy network. Accordingly, the properties are not linearly related to the concentration ratios of the free-radically polymerized materials to the cationically polymerized materials.

In the glass-transition-temperature (Tg) region a strong decrease of E' can be observed as the cationic polymer content increases (arrow 712), while tan δ shows a maximum. The temperature corresponding to such a maximum was assumed to be the Tg of the cured film. In FIG. 7A, the tan δ curves for the pure-epoxy and the IPN system are shown. In the case of the hybrid system, a broad Tg peak can be observed, with intervals in between the Tg interval of the pure acrylic and the pure epoxy UV-cured resins. This indicates a complicated polymer-network structure. As described herein, the properties of the IPN networks are not an average of the properties of the two component networks. The IPN networks have a complicated polymer network structure owing to the differences in kinetics of polymerization as a function of individual compositions. Faster polymerization of one component limits mass transfer and movement of other fragments through the vitrified matrix.

Figure 7B:
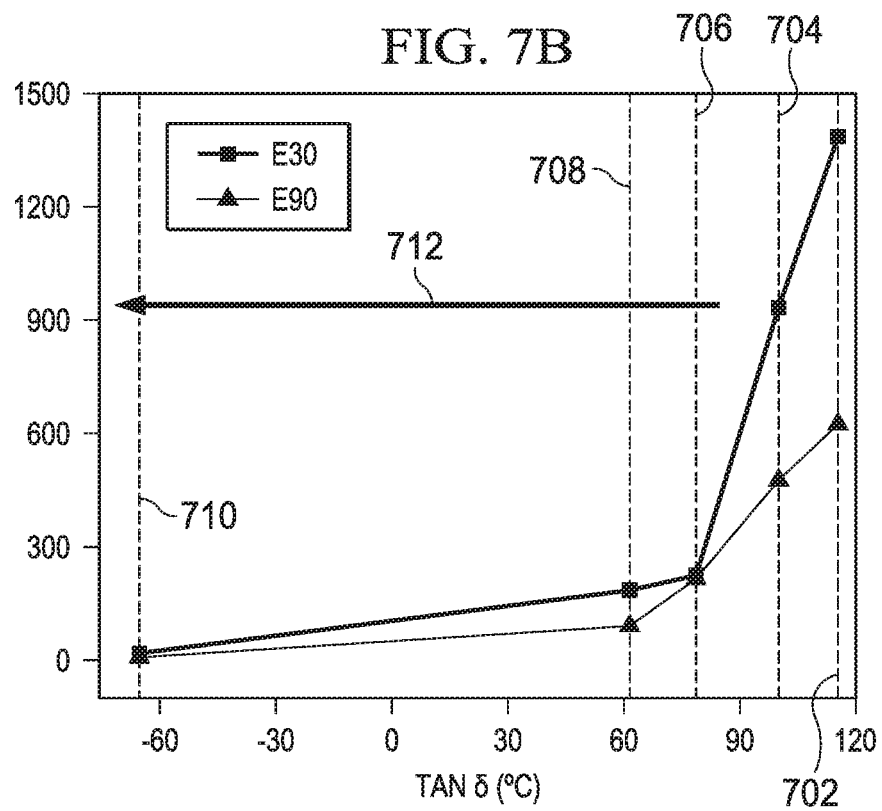
FIG. 7B is a plot of modulus values for E30 and E90 as a function of Tg and cationic polymer composition.

FIG. 7B is a plot of modulus values for E30 and E90 as a function of Tg and cationic polymer composition. The selection, formulation and/or formation of materials that have a desirable storage modulus E' and E'30: E'90 ratio in desirable regions of an advanced polishing pad by use of an additive manufacturing process is an important factor in assuring that the polishing results achieved by the advanced polishing pad are uniform across a substrate. It is noted that storage modulus E' is an intrinsic material property of a formed material, which results from the chemical bonding within a cured polymeric material. Storage modulus may be measured at a desired temperature, such as 30° C. and 90° C. using a dynamic mechanical analysis (DMA) technique. Examples of formulations that contain different storage moduli are illustrated in FIG. 1B).

As shown in the plots of FIGS. 7A and 7B, increasing the cationic ratio affords IPNs with lower Tg. This is dictated by the kinetics of acrylate vs epoxy polymerization during the UV curing process. This is further explored in the measurements shown in FIGS. 8A, 8B, 9A, and 9B.

Figure 8A:
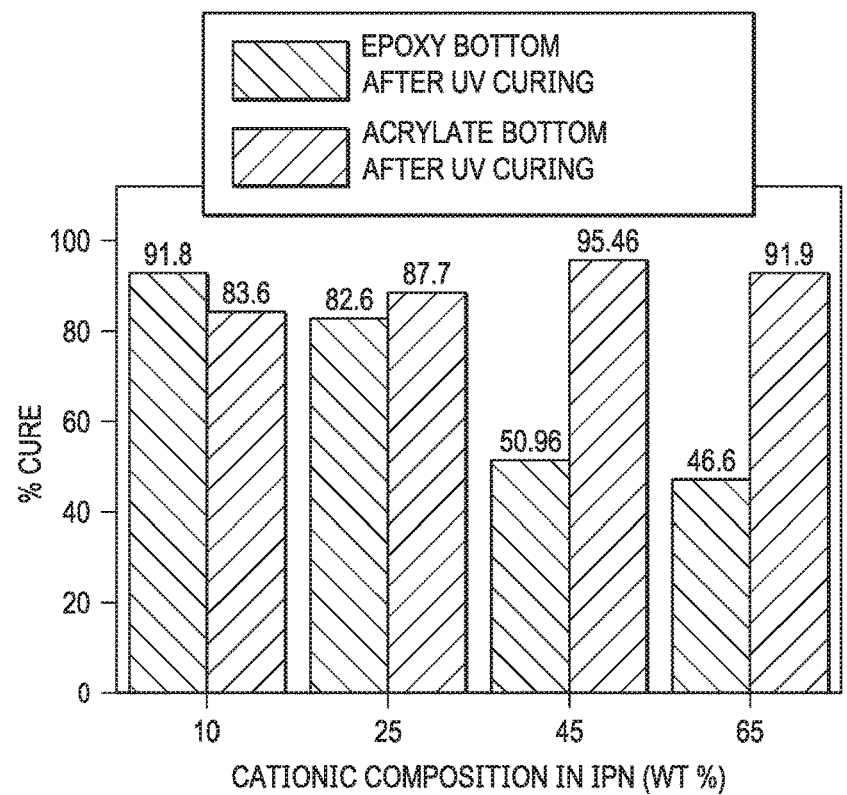
FIG. 8A is a plot of percent cure at the bottom of a droplet after UV curing as a function of polymer composition.
Figure 8B:
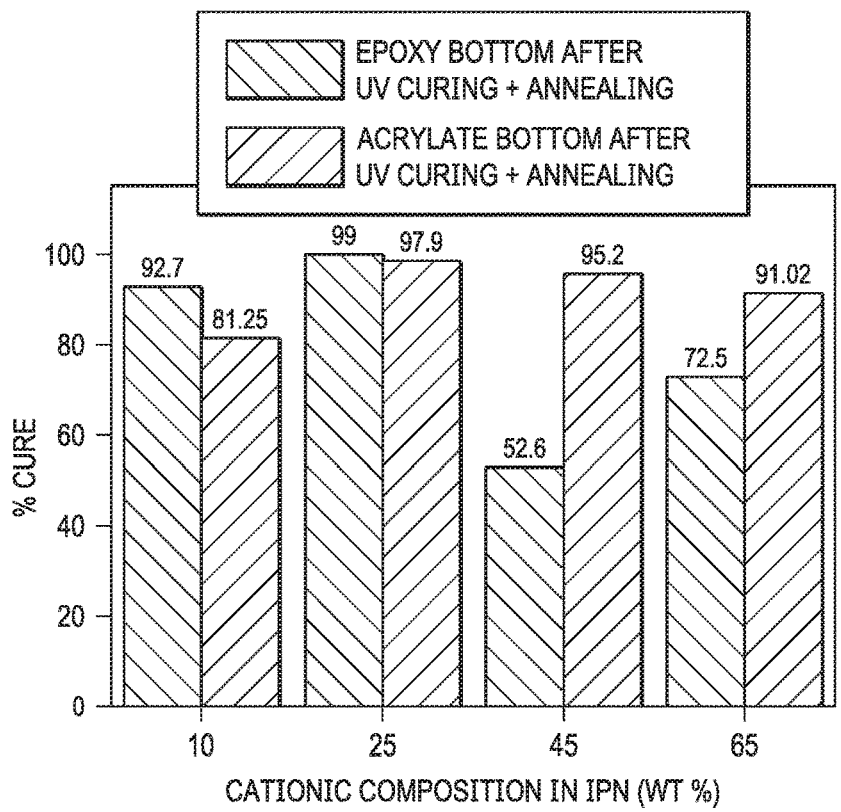
FIG. 8B is a plot of percent cure at the bottom of a droplet after UV curing and annealing as a function of polymer composition.
Figure 9A:
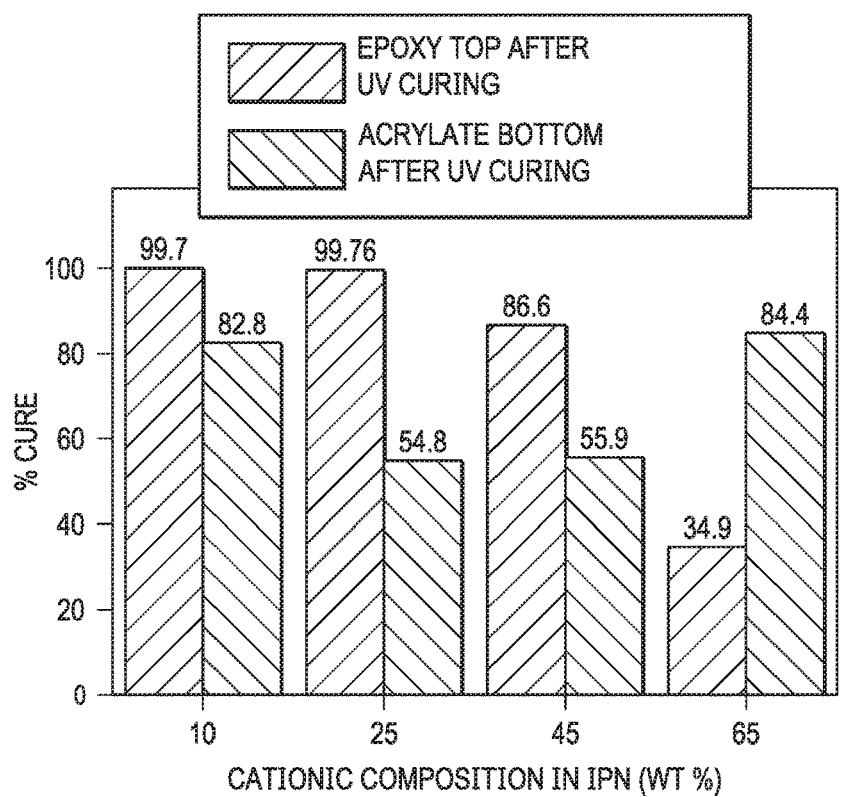
FIG. 9A is a plot of percent cure at the top of a droplet after UV curing as a function of polymer composition.
Figure 9B:
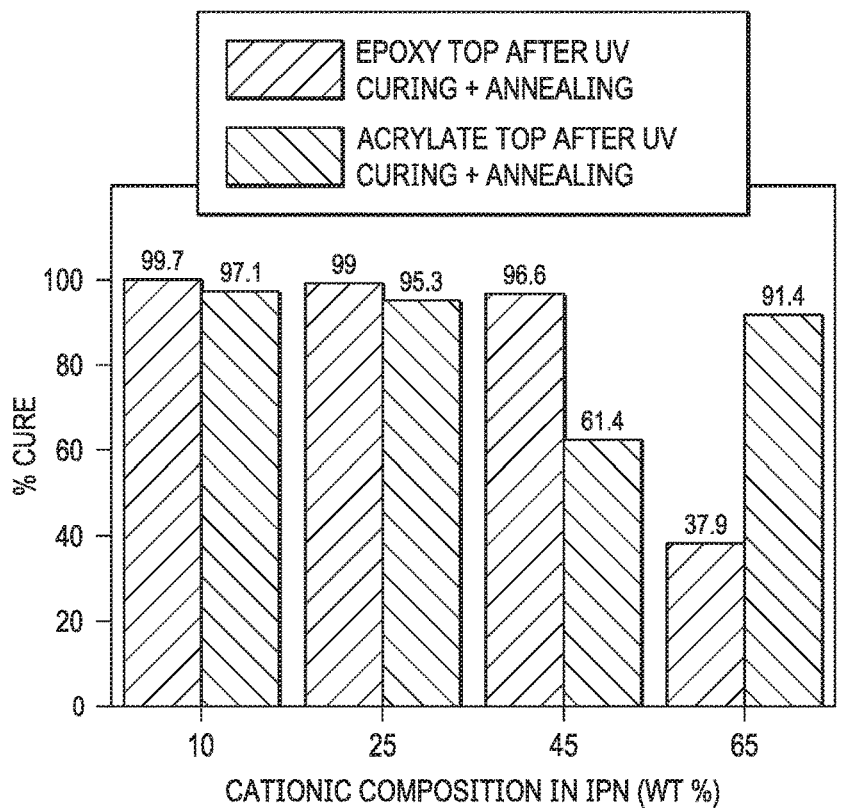
FIG. 9B is a plot of percent cure at the top of the droplet after UV curing and annealing as a function of polymer composition.

FIG. 8A is a plot of percent cure at the bottom of a droplet after UV curing as a function of polymer composition. FIG. 8B is a plot of percent cure at the bottom of a droplet after UV curing and annealing as a function of polymer composition. FIG. 9A is a plot of percent cure at the top of a droplet after UV curing as a function of polymer composition. FIG. 9B is a plot of percent cure at the top of the droplet after UV curing and annealing as a function of polymer composition.

As shown in these figures, the top cures for cationic polymers are better while through cures are better for radical curing. Acrylates cure faster than epoxy and inhibit the epoxy network formation by limiting diffusion (glassy), resulting in materials with the lowest Tg. The UV cured samples were annealed for two hours and this was found to increase top surface cures due to reduced moisture and oxygen inhibition. Further, the formulations were tuned to have viscosities between 13-15 cP which makes them amenable to inkjet printing.

Window Formulation Tests

In a similar fashion to the more general polishing pad IPN formulations, the window region formulations were tested by mixing compositions containing the free radical and cationic components, and curing films of about 2 mm in thickness by exposing them to UV light of 1150 mJ/cm$^2$. The major difference was the amount of photoinitiator used in each test. For example, results for a window formulation using 0.1 weight percent Omnirad 819 are shown in Table 2.

TABLE 2 mechanical properties of IPN formulations for pad
window cured using 0.1 weight percent OmniRad 819.

| Visc@70 (cP) | Viscosity after stability test@70 (cP) | UTS (MPa) | % EL | E30 (MPa) | E90 (MPa) | % epoxy conversion | % acrylate conversion |
|---|---|---|---|---|---|---|---|
| 12.9 | 13.2 | 29.6 | 2.8 | 1147 | 700 | T: 85<br>B: 75 | T: 89<br>B: 93 |

It can be further added that the tuning of the Tg can be used to obtain pad window compositions with varying mechanical properties. The viscosities of the above formulations are in the optimum range for inkjet printing, for example, between about 12 cP and about 16 cP, depending on the printhead. The thermal stability of these formulations can be improved by adding inhibitors, for example, Proton Sponge®, 1,8-bis(dimethylamino)naphthalene from Sigma-Aldrich, or a hindered amine light stabilizer (HALS), such as Omnistab LS292 from IGM Resins.

The jetting performance of these formulations were tested, and they were found to stably jet at 70 degrees with a drop velocity of 5.87 m/s. The print performance and the mechanical properties were validated using a Connex 500 printer from Stratasys at a concentration of 0.2 wt. % of the Omnirad 819 photoinitiator, providing the mechanical properties tabulated in Table 3.

TABLE 2 mechanical properties of IPN formulations for pad window printed
on Connex 500 using 0.2 weight percent Omnicure 819.

| Visc@70 (cP) | Viscosity after stability test@70 (cP) | UTS (Type V) (MPa) | % EL (Type V, 5 mm/min) | UTS (Type IV) (MPa) | % EL (Type IV, 5 mm/min) | E30 (MPa) | E90 (MPa) | % epoxy conversion | % acrylate conversion |
|---|---|---|---|---|---|---|---|---|---|
| 13.4 | 13.6 | 48.9 | 6.4 | 44 | 6.2 | 1380 | 530 | T: 70<br>B: 77 | T: 65<br>B: 69 |

Note that the dogbone test samples are prepared according to ASTM D638 (Type V and Type IV).

Figure 10:
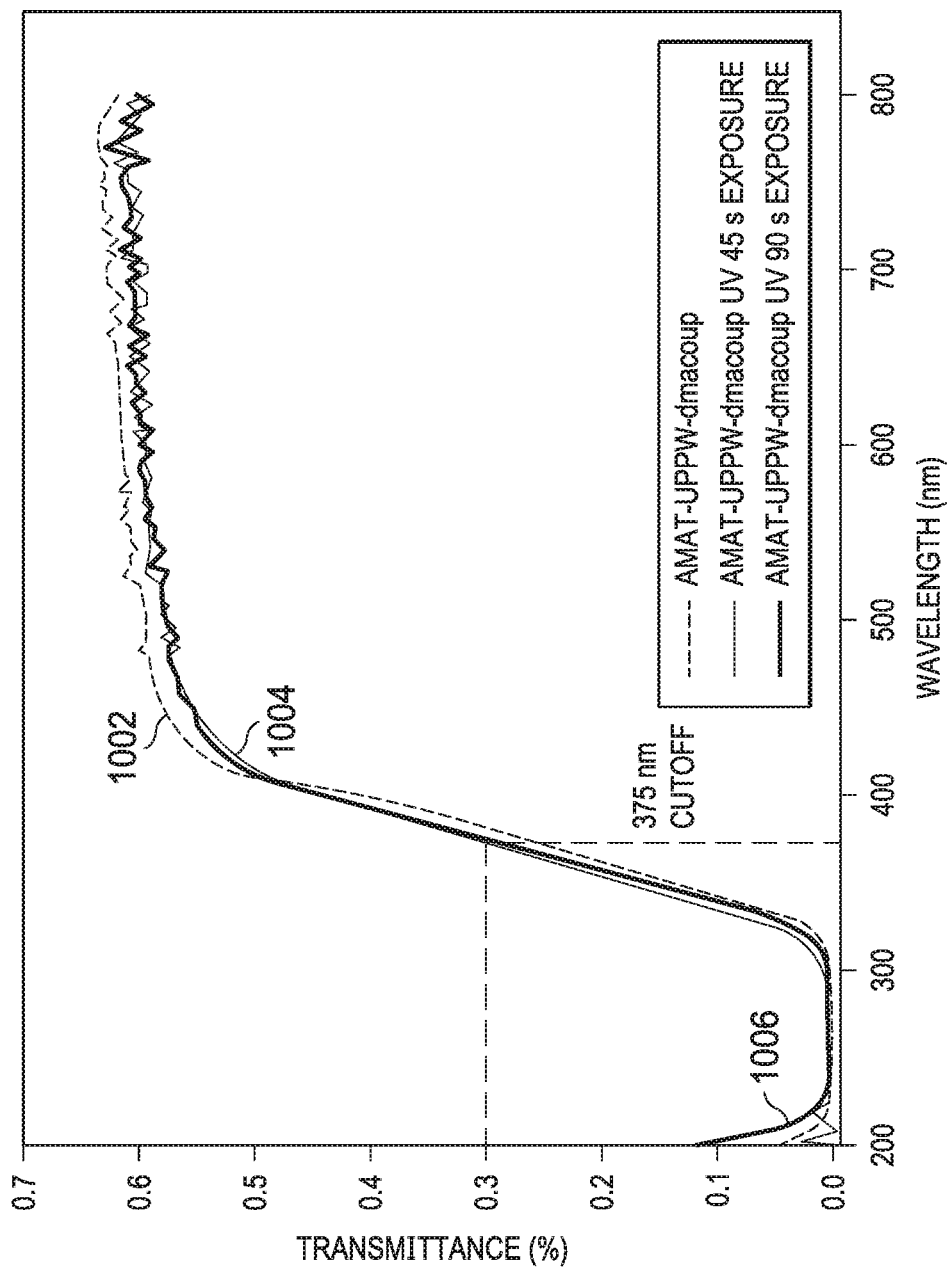
FIG. 10 is a plot of light transmittance as a function of wavelength (nm).

FIG. 10 is a plot of polymer transmittance as a function of wavelength (nm). Finally, the cutoff wavelength and transmittance data for the pad window are shown in FIG. 10. The cutoff wavelength was 375 nm with an optical transmittance of about 50% at wavelength>400 nm while those for commercial windows is 395 nm with a transmittance of 50% at wavelengths>400 nm. Further, the cutoff does not change after 6 million flashes of UV, which is after 45 second exposure accounting for one pad life or even after 90 second exposure indicating the stability of the pad window.

An implementation described herein provides a method of generating a formulation for a polishing pad including an interpenetrating polymer network (IPN). The method includes selecting a cationically polymerized material and a free-radically polymerized material to control properties of the polishing pad and blending the cationically polymerized material with the free-radically polymerized material to form a precursor blend, wherein a ratio of the cationically polymerized material to the pre-radically polymerized material in the precursor blend is selected to control the properties of the polishing pad. A free radical photoinitiator and a cationic photoinitiator are blended with the precursor blend to form an active blend, and the active blend is provided to a manufacturer to generate the polishing pad using a three-dimensional printer.

In an aspect, the properties include elongation at break, ultimate tensile strength (UTS), storage modulus, or glass transition temperature, or any combinations thereof. In an aspect, a maximum value of a viscosity of the active blend is 20 centipoise (cP).

Another implementation described herein provides a method of manufacturing a polishing pad including an interpenetrating polymer network (IPN). The method includes obtaining an active blend including a free radical photoinitiator, a free-radically polymerized material, a cationic photoinitiator, a cationically polymerized material, wherein a ratio of the free-radically polymerized material to the cationically polymerized material in the active blend is selected to control properties of the polishing pad. A raw polishing pad is formed from the active blend, and the raw polishing pad is irradiated to initiate a free-radical photopolymerization of the free-radically polymerized material and a cationic photopolymerization of the cationically polymerized material.

In an aspect, the free-radically polymerized material includes a urethane acrylate material. In an aspect, the cationically polymerized material includes an epoxy oligomer.

In an aspect, the method includes forming the raw polishing pad by printing droplets of the active blend from a 3D printer nozzle to form a layer in a 3D printer and irradiating the raw polishing pad to initiate the free-radical photopolymerization and the cationic photopolymerization of the droplets.

In an aspect, the polishing pad is annealed to complete curing of the interpenetrating polymer network. In an aspect, the polishing pad is annealed by irradiating the polishing pad. In an aspect, a viscosity of the active blend is less than 20 centipoise (cP).

Another implementation disclosed herein provides a polishing pad for a semiconductor fabrication operation. The polishing pad includes an interpenetrating polymer network formed from a free radically polymerized material and a cationically polymerized material.

In an aspect, the free radically polymerized material includes a urethane acrylate oligomer. In an aspect, the cationically polymerized material includes an epoxy oligomer.

In an aspect, a ratio of the cationically polymerized material to the free-radically polymerized material is controlled to achieve a target property. In an aspect, the ratio of the cationically polymerized material to the free-radically polymerized material is between 10 wt. % and 65 wt. %. In an aspect, the ratio of the cationically polymerized material to the free radically polymerized material is about 25 wt. %.

In an aspect, the target property is an E'30 modulus. In an aspect, the E'30 modulus is between 5 megapascals (MPa) and 100 MPa. In an aspect, the E'30 modulus is between 101 megapascals (MPa) and 500 MPa. In an aspect, the E'30 modulus is between 501 megapascals (MPa) and 3000 MPa.

A number of implementations have been described. Nevertheless, it will be understood that various modifications may be made without departing from the spirit and scope of the disclosure. For example, either the polishing pad, or the carrier head, or both can move to provide relative motion between the polishing surface and the substrate. The polishing pad can be a circular or some other shape. An adhesive layer can be applied to the bottom surface of the polishing pad to secure the pad to the platen, and the adhesive layer can be covered by a removable liner before the polishing pad is placed on the platen. In addition, although terms of vertical positioning are used, it should be understood that the polishing surface and substrate could be held upside down, in a vertical orientation, or in some other orientation. Accordingly, other implementations are within the scope of the following claims.

What is claimed is:

1. A method of generating a formulation for a polishing pad comprising an interpenetrating polymer network (IPN), comprising:
   selecting a cationically polymerized material and a free-radically polymerized material to control properties of the polishing pad;
   blending the cationically polymerized material with the free-radically polymerized material to form a precursor blend, wherein a ratio of the cationically polymerized material to the free-radically polymerized material in the precursor blend is selected to control the properties of the polishing pad;
   blending a free radical photoinitiator and a cationic photoinitiator with the precursor blend to form an active blend; and
   providing the active blend to a manufacturer to generate the polishing pad using a three dimensional printer.

2. The method of claim 1, wherein the properties comprise elongation at break, ultimate tensile strength (UTS), storage modulus, or glass transition temperature, or any combinations thereof.

3. The method of claim 1, wherein a maximum value of a viscosity of the active blend is 20 centipoise (cP).

4. A method of manufacturing a polishing pad comprising an interpenetrating polymer network (IPN), comprising:
   obtaining an active blend comprising
       a free radical photoinitiator,
       a free-radically polymerized material,
       a cationic photoinitiator, and
       a cationically polymerized material, wherein a ratio of the free-radically polymerized material to the cationically polymerized material in the active blend is selected to control properties of the polishing pad;
   forming a raw polishing pad from the active blend; and
   irradiating the raw polishing pad to initiate a free-radical photopolymerization of the free-radically polymerized material and a cationic photopolymerization of the cationically polymerized material.

5. The method of claim 4, wherein the free-radically polymerized material comprises a urethane acrylate material.

6. The method of claim 4, wherein the cationically polymerized material comprises an epoxy oligomer.

7. The method of claim 4, further comprising:
   forming the raw polishing pad by printing droplets of the active blend from a 3D printer nozzle to form a layer in a 3D printer; and
   irradiating the raw polishing pad to initiate the free-radical photopolymerization and the cationic photopolymerization of the droplets.

8. The method of claim 4, comprising annealing the polishing pad to complete curing of the interpenetrating polymer network.

9. The method of claim 8, comprising annealing the polishing pad by irradiating the polishing pad.

10. The method of claim 4, wherein a viscosity of the active blend is less than 20 centipoise (cP).

* * * * *